(12) United States Patent
Erdociain Gil

(10) Patent No.: US 12,119,787 B2
(45) Date of Patent: Oct. 15, 2024

(54) WIRELESS NON-INVASIVE DEVICE FOR MONITORING CURRENT DIRECTLY IN THE WIRING OF PHOTOVOLTAIC INSTALLATIONS

(71) Applicant: CHEMIK TARAZONA, S.L.U., Saragossa (ES)

(72) Inventor: Hector Erdociain Gil, Saragossa (ES)

(73) Assignee: CHEMIK TARAZONA, S.L.U., Saragossa (ES)

( * ) Notice: Subject to any disclaimer, the term of this patent is extended or adjusted under 35 U.S.C. 154(b) by 84 days.

(21) Appl. No.: 17/914,310

(22) PCT Filed: Feb. 23, 2021

(86) PCT No.: PCT/ES2021/070125
§ 371 (c)(1),
(2) Date: Sep. 23, 2022

(87) PCT Pub. No.: WO2021/191480
PCT Pub. Date: Sep. 30, 2021

(65) Prior Publication Data
US 2023/0120876 A1 Apr. 20, 2023

(30) Foreign Application Priority Data
Mar. 25, 2020 (ES) .............................. ES202030539U

(51) Int. Cl.
*H02S 50/10* (2014.01)
*G01R 11/04* (2006.01)
(Continued)

(52) U.S. Cl.
CPC .............. *H02S 50/10* (2014.12); *G01R 11/04* (2013.01); *G01R 15/202* (2013.01);
(Continued)

(58) Field of Classification Search
CPC .. G01R 11/04; G01R 15/202; G01R 19/0092; G06K 19/0723; H02S 40/36; H02S 50/00; H02S 50/10; Y02E 10/50
See application file for complete search history.

(56) References Cited

U.S. PATENT DOCUMENTS

| 2018/0351401 A1* | 12/2018 | Binder .............. H02J 13/00002 |
| 2019/0086449 A1* | 3/2019 | Sugar ................. G06K 19/0716 |
| 2022/0173696 A1* | 6/2022 | Hernandez Martinez ................... H02S 50/10 |

FOREIGN PATENT DOCUMENTS

| KR | 101169289 B1 | 7/2012 |
| KR | 101176012 B1 | 8/2012 |

(Continued)

OTHER PUBLICATIONS

International Search Report for corresponding PCT application No. PCT/ES2021/070125, mailed May 17, 2021.

*Primary Examiner* — Neel D Shah
*Assistant Examiner* — Adam S Clarke
(74) *Attorney, Agent, or Firm* — Notaro, Michalos & Zaccaria P.C.

(57) ABSTRACT

A wireless, non-invasive equipment for the monitoring of current flow directly in the wiring of the photovoltaic installations without having to cut the wire, that aims to remotely monitor and send the current readings of the wiring coming out of the photovoltaic solar panels, without having to disconnect the wires is disclosed. It consists in a portable housing, including inside a control circuit with its corresponding microprocessor and its DC/DC. The microprocessor is connected to different Hall effect sensors in order to measure the current flow through the wires of the installation and a RIFD reader for the identification of the installation.

(Continued)

The equipment has a wireless communications module that sends the measured values together with the identification code of the installation.

3 Claims, 1 Drawing Sheet

(51) Int. Cl.
    *G01R 15/20*     (2006.01)
    *G01R 19/00*     (2006.01)
    *G06K 19/07*     (2006.01)
    *H02S 40/36*     (2014.01)

(52) U.S. Cl.
    CPC .......... *G01R 19/0092* (2013.01); *H02S 40/36* (2014.12); *G06K 19/0723* (2013.01)

(56) References Cited

FOREIGN PATENT DOCUMENTS

| | | |
|---|---|---|
| TW | 201104634 A | 2/2011 |
| TW | 201105021 A | 2/2011 |

\* cited by examiner

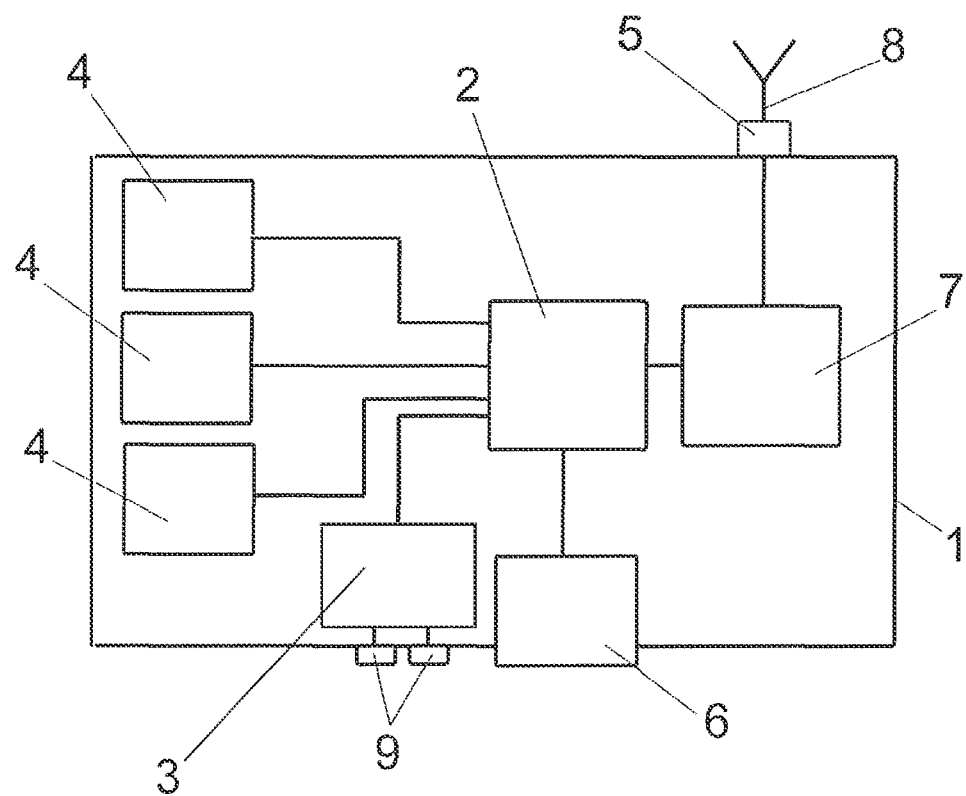

WIRELESS NON-INVASIVE DEVICE FOR MONITORING CURRENT DIRECTLY IN THE WIRING OF PHOTOVOLTAIC INSTALLATIONS

FIELD OF TECHNOLOGICAL INVENTION

This invention relates to a wireless, non-invasive equipment for the monitoring of current flow directly in the wiring of the photovoltaic installations without cutting the cable, which aims to remotely monitor and send the current readings of the wiring coming out of the photovoltaic solar panels, without having to disconnect the wires.

BACKGROUND OF THE INVENTION

In the practical application of the invention, the photovoltaic solar equipments, it is common to control the electrical current generated by the different panels, in order to ensure their correct operation.

The common wiring measurement equipments used until now were connected in series between the wires, so it was necessary to cut them in order to connect the measurement equipment, operation which can lead to loss of time, more problematic connections and the electrical risks that this can cause.

DESCRIPTION OF THE INVENTION

The here proposed equipment solves the above-mentioned problems in a fully satisfactory manner, based on a simple but effective solution.

For this purpose, the invention consists in a compact, wireless equipment that does not require any operation with the wires associated to the photovoltaic solar panel to be monitored.

More specifically, the equipment is made up of a small housing containing a control circuit with a microprocessor, associated with Hall effect sensors, prepared to measure the current flow through the mentioned wires. The outputs of the sensors are managed by the microcontroller, obtaining the value of the current, which is unequivocally associated with the related installation, which will have a Radio Frequency Identification (RIFD) identifier. This information is sent via a standard wireless communications module to the control unit through the corresponding antenna.

The equipment can be powered in two different ways: through a small connected photovoltaic solar panel, or through the auxiliary photovoltaic panel which is connected to the monitoring control system of the installation.

The housing is fitted with an antenna connector (5) to place the antenna directly or to connect a wire and take the antenna out to a visible area.

The fixing system of the equipment can consist in a metal flange, or it can be also fixed by means of the inserts on its back side.

BRIEF DESCRIPTION OF THE DRAWINGS

In order to further illustrate the following description and assist in a better understanding of the invention's features, in accordance with a preferred sample of embodiment of the invention, a drawing is attached as an integral part of the description, in which the following has been represented for illustrative but non-limitative purposes:

FIG. 1.—It shows a block diagram of the main elements involved in a wireless and non-invasive equipment for current monitoring in the wiring of photovoltaic installations carried out in accordance with the purpose of this invention.

PREFERRED EMBODIMENT OF THE INVENTION

On the FIGURE shown, it can be noted that the equipment of the invention is made up of a portable housing (1), which includes inside a control circuit with its corresponding microprocessor (2) and its direct current to direct current (DC/DC) device (3). The microprocessor is connected to different Hall effect sensors (4), which can monitor the current flow through the wires of a photovoltaic solar installation without having to manipulate them.

The outputs of the sensors are managed by the microcontroller, obtaining the value of the current, which is unequivocally associated with the related installation, which includes a RIFD reader (6), which reads the related identifiers corresponding to each set of panels. This information is adapted by the microprocessor and is sent to the corresponding control device through a wireless communications module (7), for example a LoRa or LoRaWAN type, with its corresponding antenna connector (5) and antenna (8).

Finally, the equipment can be powered by a small integrated on it solar photovoltaic panel or can be connected via the pertinent connectors (9) to the auxiliary photovoltaic panel connected to the monitoring control system of the installation.

The invention claimed is:

1. A wireless, non-invasive equipment for monitoring of current flow directly in wiring of a photovoltaic installation, comprising:
   a portable housing (1) enclosing a control circuit (2) and a direct current to direct current (DC/DC) device (3);
   wherein the control circuit has a corresponding microprocessor connected to each of one or more Hall effect sensors (4), which each monitors a current flow through an associated set of wires of the photovoltaic installation, the corresponding microprocessor configured to obtain a value for the current flow through each set of wires based on an output from the one of the one or more Hall effect sensors (4) associated with that set of wires;
   a radio frequency identification (RIFD) reader (6) associated with the corresponding microprocessor for reading identifiers corresponding to each set of panels in the photovoltaic installation; and
   a wireless communications module (7) for sending the obtain current values together with the identifiers ready by the RFID reader (6) through an associated antenna.

2. The wireless, non-invasive equipment of claim 1, further comprising a solar photovoltaic panel coupled to the DC/DC device (3) for providing power for the wireless, non-invasive equipment.

3. The wireless, non-invasive equipment of claim 1, further comprising an auxiliary photovoltaic panel coupled to the DC/DC device (3) via connectors (9) so that the auxiliary photovoltaic panel provides power for the wireless, non-invasive equipment.

* * * * *